(12) United States Patent
Arumugam

(10) Patent No.: US 10,697,752 B2
(45) Date of Patent: Jun. 30, 2020

(54) APERTURE-COUPLED MAGNETOELECTRIC QUASISTATIC SENSING

(71) Applicant: CALIFORNIA INSTITUTE OF TECHNOLOGY, Pasadena, CA (US)

(72) Inventor: Darmindra D. Arumugam, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 16/470,189

(22) PCT Filed: Apr. 11, 2018

(86) PCT No.: PCT/US2018/027184
§ 371 (c)(1),
(2) Date: Jun. 14, 2019

(87) PCT Pub. No.: WO2018/191428
PCT Pub. Date: Oct. 18, 2018

(65) Prior Publication Data
US 2020/0088506 A1    Mar. 19, 2020

Related U.S. Application Data

(60) Provisional application No. 62/484,796, filed on Apr. 12, 2017.

(51) Int. Cl.
*G01B 7/00* (2006.01)
*G01R 29/08* (2006.01)
*G01N 27/72* (2006.01)

(52) U.S. Cl.
CPC ............. *G01B 7/003* (2013.01); *G01N 27/72* (2013.01); *G01R 29/08* (2013.01)

(58) Field of Classification Search
CPC ........ G01B 7/004; G01N 27/82; G01R 29/08; G01R 29/0871; G01R 29/0892
See application file for complete search history.

(56) References Cited

U.S. PATENT DOCUMENTS

| 4,314,251 A | 2/1982 | Raab et al. |
| 6,249,680 B1 * | 6/2001 | Wax ........................ G01C 21/26 370/335 |

(Continued)

OTHER PUBLICATIONS

Arumugam, D. et al., "Higher Order Loop Corrections for Short Range Magnetoquasistatic Position Tracking", 2011 IEEE International Symposium on Antennas and Propagation (AP-S/URSI), pp. 1755-1757, (2011).

(Continued)

*Primary Examiner* — Huy Q Phan
*Assistant Examiner* — Dustin R Dickinson
(74) *Attorney, Agent, or Firm* — Steinfl + Bruno LLP

(57) ABSTRACT

Quasistatic through-the-wall non-line-of-sight coupling between a mobile transmitting device located within a metallic enclosure, and a fixed receiving device located outside the enclosure, enables positioning of the transmitting device through the wall of the enclosure and in non-line-of-sight environments. The coupling of the magnetic and electric quasistatic fields occurs through a small aperture in the metallic enclosure, such as the gap normally present in the hatch of industrial metallic enclosures.

17 Claims, 6 Drawing Sheets

(56) References Cited

U.S. PATENT DOCUMENTS

| | | | |
|---|---|---|---|
| 6,757,557 | B1 | 6/2004 | Bladen et al. |
| 7,289,913 | B2 | 10/2007 | Schlicker et al. |
| 8,723,509 | B2 | 5/2014 | Patterson, III et al. |
| 9,451,339 | B2 | 9/2016 | Kauffman et al. |
| 9,638,521 | B2 | 5/2017 | Arumugam et al. |
| 10,352,680 | B2 | 7/2019 | Arumugam |
| 2002/0158626 | A1* | 10/2002 | Shay ............... G01N 27/82 324/207.16 |
| 2006/0267833 | A1* | 11/2006 | Langford ............ G01S 5/0252 342/174 |
| 2011/0316529 | A1 | 12/2011 | Stancil et al. |
| 2013/0002275 | A1* | 1/2013 | Min ................. G01R 35/005 324/750.02 |
| 2014/0266164 | A1 | 9/2014 | Arumugam et al. |
| 2016/0097656 | A1 | 4/2016 | Arumugam |
| 2017/0131080 | A1 | 5/2017 | Arumugam et al. |

OTHER PUBLICATIONS

Arumugam, D.D. et al., "Errror Reduction in Magnetoquasistatic Positioning Using Orthogonal Emitter Measurement", IEEE Antennas and Wireless Propagation Letters, vol. 11, pp. 1462-1465, (2012).

Arumugam, D.D. et al., "Experimental Demonstration of Complex Image Theory and Application to Position Measurement", IEEE Antennas and Wireless Propagation Letters, vol. 10, pp. 282-285, (2011).

Arumugam, D.D. et al., "Three-Dimensional Position and Orientation Measurements Using Magneto-Quasistatic Fields and Complex Image Theory", IEEE Antennas and Propagation Magazine, vol. 56, No. 1, pp, 160-173, (Feb. 2014).

Arumugam, D.D. "Full-Wave Exact Integral Solutions of a Current Carrying Loop in a General Half-Space" *2013 IEEE Antennas and Propagation Society International Symposium (APSURSI )*, *Institute of Electrical and Electronics Engineers*. 2013. pp. 1038-1039. 3 pages.

Arumugam, "Decoupled Range and Orientation Sensing in Long-Range Magnetoquasistatic Positioning," in IEEE Antennas and Wireless Propagation Letters, vol. 14, No. , pp. 654-657, 2015.

Arumugam, et al., "Experimental study on the effects of groups of people on magnetoquasistatic positioning accuracy," in Antennas and Propagation Society International Symposium (APSURSI), 2012 IEEE, 2012, pp. 1-2.

Arumugam, "Single-Anchor 2-D Magnetoquasistatic Position Sensing for Short to Long Ranges Above Ground," in IEEE Antennas and Wireless Propagation Letters, vol. 15, No., pp. 1325-1328, 2016.

Bannister et al., "Modified Image Theory Quasi-Static Range Subsurface-to-Subsurface and Subsurface-to-Air Propagation Equations" *NUSC Technical Report, Naval Underwater Systems Center*. Oct. 1977. No. 5647. 38 pages.

Bouwkamp, "Theoretical and numerical treatment of diffraction through a circular aperture," IEEE Trans. Antennas Propagation, vol. AP-18, pp. 152-176, Mar. 1970.

De Angelis et al. "An indoor AC Magnetic Positioning System" *IEEE Transactions on Instrumentation and Measurement, Institute of Electrical and Electronics Engineers*. May 2015. vol. 64, No. 5. pp. 1275-1283. 9 pages.

Denis, B. et al., "Impact of NLOS Propagation upon Ranging Precision in UWB Systems", IEEE Conference on Ultra Wideband Systems and Technologies, pp. 379-383, (Nov. 16-19, 2003).

Eggimann, "Higher-order evaluation of electromagnetic diffraction by circular disks," IRE Trans. Microwave Theory Tech., vol. MTI-9, pp. 408-418, Sep. 1961.

Fang, D.G. et al., "Discrete Image Theory for Horizontal Electric Dipoles in a Mulitlayered Medium", IEEE Proceedings on Microwaves, Antennas and Propagation, 135(5), pp. 297-303, (Oct. 1988).

International Search Report for PCT/US2018/027184 filed Apr. 11, 2018 on behalf of California Institute of Technology, dated Jul. 30, 2018. 3 pages.

Jiang, Z. et el., "NLOS GPS Signal Detection using a Dual-Polarisation Antenna", GPS Solutions, vol. 18, pp. 15-26, (2014).

Koutsou, A.D. et al,, "Preliminary Localization Results Witt an RFID Based Indoor Guiding System", Intelligent Signal Processing, IEEE International Symposium, pp. 1-6, (2007).

Kriezis, E.E. et al., "Eddy Current Distribution and Loss in a Semi-Infinite Conducting Space Due to a Vertical Current Loop", ETZ Archive, pp. 201-207, (Jul. 1979).

Notice of Allowance for U.S. Appl. No. 15/339,663 filed Oct. 31, 2016 on behalf of California Institute of Technology, dated Apr. 3, 2019. 10 pages.

Notice of Allowance for U.S. Appl. No. 15/339,663 filed Oct. 31, 2016, on behalf of California Institute of Technology, dated Dec. 28, 2018. 10 pages.

Notice of Allowance for U.S. Appl. No. 14/876,736 filed Oct. 6, 2015 on behalf of California Institute of Technology, dated Jan. 26, 2017. 9 pages.

Raab, F.H. "Quasi-Static Magnetic-Field Technique for Determining Position and Orientation", IEEE Transactions on Geoscience and Remote Sensing, vol. Ge-19, No. 4, pp. 235-243, (Oct. 1981).

Raab, F.R. et al., "Magnetic Position and Orientation Tracking System", IEEE Transactions on Aerospace and Electronic Systems, vol. AES-15, No. 5, pp. 709-718, (Sep. 1979).

Schweizer, J. et al., "Testing the Performance of Avalanche Transreceivers", Cold Regions Science and Technology, 37, pp. 429-438, (2003).

Arumugam, "Through-the-wall magnetoquasistatic ranging," in IEEE Antennas and Wireless Propagation Letters , Dec. 19, 2016, vol. 16, pp. 1439-1442.

Wait, J.R. "Image Theory of a Quasistatic Magnetic Dipole Over a Dissipative Half Space" *Electronics Letters, Institute of Electrical and Electronics Engineers*. Jun. 1969. vol. 5, No. 13. pp. 281-282. 3 pages.

Written Opinion for PCT/US2018/027184 filed Apr. 11, 2018 on behalf of California Institute of Technology, dated Jul. 30, 2018. 6 pages.

* cited by examiner

APERTURE-COUPLED MAGNETOELECTRIC QUASISTATIC SENSING

CROSS REFERENCE TO RELATED APPLICATIONS

The present application is the U.S. National Stage of International Patent Application No. PCT/US2018/027184 filed on Apr. 11, 2018 which claims priority to U.S. Provisional Patent Application No. 62/484,796, filed on Apr. 12, 2017, the disclosure of which is incorporated herein by reference in its entirety.

STATEMENT OF INTEREST

The invention described herein was made in the performance of work under a NASA contract NNN12AA01C, and is subject to the provisions of Public Law 96-517 (35 USC 202) in which the Contractor has elected to retain title.

TECHNICAL FIELD

The present disclosure relates to remote sensing. More particularly, it relates to aperture-coupled magnetoelectric quasistatic sensing.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

SUMMARY

Figure 1:
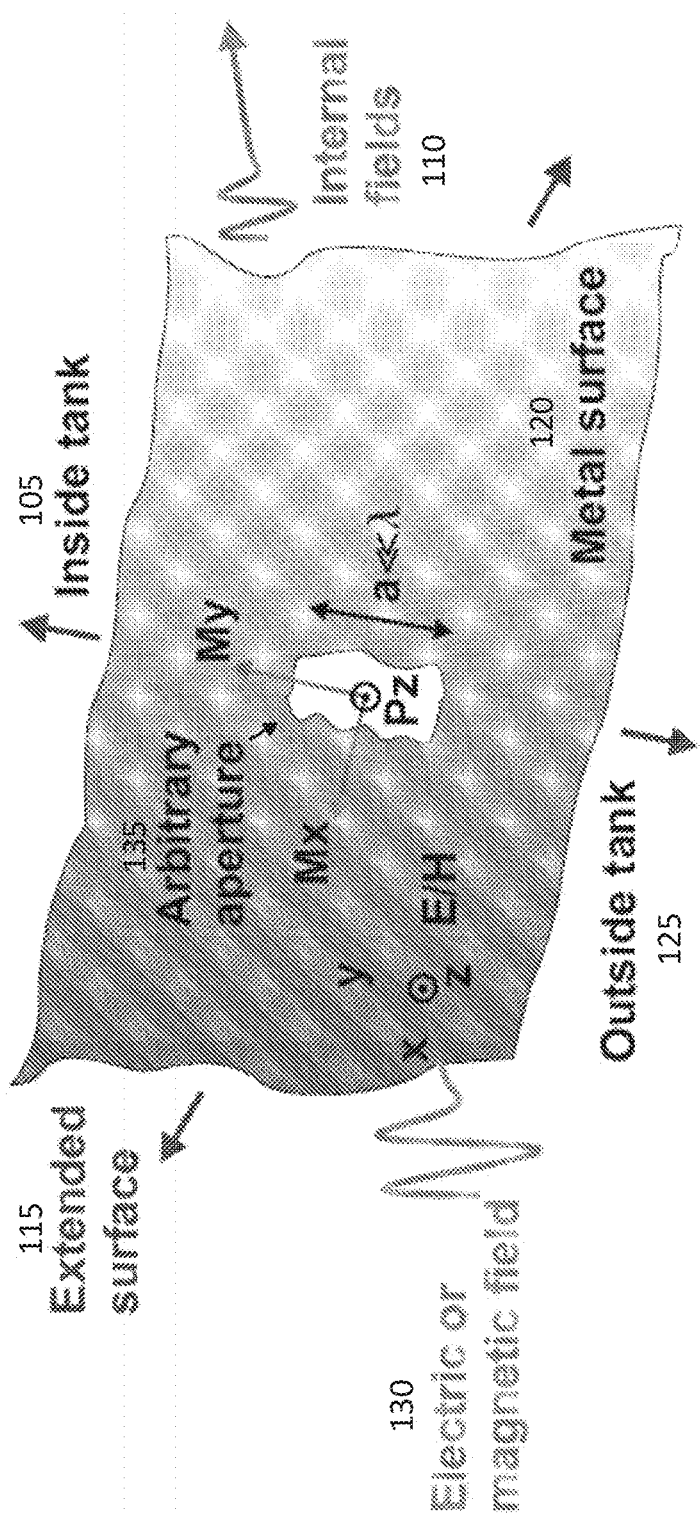
FIGS. 1-2 illustrate exemplary sets of fields for an aperture in a metallic surface.

In a first aspect of the disclosure, a method is described, the method comprising: providing at least one transmitter configured to transmit a quasistatic field at a first wavelength; positioning the at least one transmitter at a distance less than the first wavelength from a metallic container and outside the metallic container, the metallic container comprising metallic walls entirely enclosing an inner space apart from at least one aperture in the metallic walls, the at least one aperture having lateral dimensions less than the first wavelength; providing at least one receiver configured to detect the quasistatic field, the at least one receiver being located within the metallic container; transmitting the quasistatic field with the at least one transmitter; coupling the quasistatic field at the at least one aperture; approximating the quasistatic field at the last one aperture as a dipole field; measuring the quasistatic field with the at least one receiver; and determining a position within the metallic container of the at least on receiver based on the measured quasistatic field, wherein the quasistatic field is a quasistatic electric field, a quasistatic magnetic field, or an electromagnetic quasistatic field.

DETAILED DESCRIPTION

The present disclosure describes accurate three-dimensional (3D) positioning, with reference to non-line-of-sight applications. Recent advances in magnetoquasistatic techniques have enabled accurate position and orientation sensing in many non-line-of-sight applications, including challenging indoor navigation applications. As known to the person of ordinary skill in the art, magnetoquasistatic fields are not-significantly perturbed or blocked by proximity to lossy dielectric materials and electrically-small conductors. Therefore, magnetoquasistatic fields are useful for navigational and positional sensing, as described, for example, in Refs. [1-3].

An extreme case of the application of positioning based on magnetoelectric quasistatic fields concerns environments containing heavy metallic materials, such as, for example, metal tanks, metal enclosures, or similar. For example, shipping containers are made of heavy metallic enclosures with thick metallic walls. Fuel tanks can likewise be made of thick metallic walls.

The present disclosures can refer to all such types of metallic containers and tanks as "metallic containers", "metal containers" or simply "containers" or "tanks". Examples of applications of remote sensing as described herein include, for example, navigation of remotely operated vehicles (ROV) within metallic tanks, such as onshore oil or water storage tanks, offshore oil platform ballast tanks, et cetera. This type of ROV can be used, for example, for tracking people within confined metal areas or refineries, for safety, rescue, or monitoring, or other similar uses.

While a variety of techniques and methods based on the propagation of electromagnetic (EM) fields have been studied and developed for positioning in the past, existing techniques can suffer severely reduced accuracy or inoperability in the metal-container environments described above. In contrast to the propagation of EM (e.g. radio) waves, quasistatic fields of an electromagnetic source can penetrate into most mediums with low loss. Quasistatic fields are also not significantly disturbed in non-line-of-sight (NLoS) environments or when the line-of-sight to the device is blocked. Within the sub-wavelength regime, it is possible to generate quasistatic electric fields or magnetic fields, depending on the nature of the field sources. Quasistatic magnetic fields are weakly perturbed by most common materials, therefore having obvious benefits, and have been recently demonstrated to enable accurate long-range outdoor and indoor NLoS position sensing. Additionally, recent theoretical and experimental research has identified a deep-subwavelength regime of the quasistatic magnetic coupling that permits a simplified expression of the coupling for an emitting device through a conducting/lossy medium, as described in Ref. [3]. Within this regime, the fields are not affected by volume eddy-currents, and can be inverted linearly to determine the 3D position and orientation of the positioning device. Due to the spatial variation of the quasistatic field, this type of technique also permits full positioning from a single, base sensor, without relying on triangulation or trilateration. The person of ordinary skill in the art will understand that the magnetoelectric quasistatic fields used in the methods of the present disclosure are not the same as EM waves as normally understood (such as light radiation, for example). Therefore, the present disclosure refers to such quasistatic fields as "magnetoelectric quasistatic fields" to distinguish them from EM wave radiation.

A question therefore arises about the viability of magnetoelectric quasistatic position sensing in metallic containers, where the mobile sensor to be tracked is located inside the metallic container, and the fixed base station to receive/sense and invert the fields for position and navigation is located outside the tank. The person of ordinary skill in the art will understand that, in some embodiments, the positions of the sensor and of the base station may be inverted, so that the detecting station is inside the metallic container, and the sensor to be detected is located outside the container.

The most challenging environment is where the metallic container is completely sealed, except at one or more joints where a metal door, for example a pressurized metal door, is closed with bolts or similar means. For example, onshore water tanks, or off shore water tanks in the oil and gas industry, typically have a pressurized metal door with one or more joints.

For this type of metallic container, it is possible to assume that the conducting walls are composed of good conductors and that the walls are electrically thick, or having a thickness greater than some skin-depths. As known to the person of ordinary skill in the art, EM waves incident on a surface may penetrate the material with an exponential decrease in intensity. The penetration depth therefore is a measure of how deeply electromagnetic radiation can penetrate into a material. The penetration depth is defined as the depth at which the intensity of the radiation inside the material falls to 1/e (about 37%) of its original value at the surface.

A related concept is the skin depth, a term usually applying to metals in reference to the decay of electrical currents. In certain situations, as known to the person of ordinary skill in the art, the electric current flows mainly at the "skin" of a conductor, between the outer surface and a level called the skin depth.

Industrial metallic containers commonly have wall thicknesses greater than a skin depth. For example, this condition occurs in onshore water tanks, or off shore water tanks in the oil and gas industry. Within this regime of operation, the magnetoelectric quasistatic field must penetrate through the nearest opening, where the opening is due to an electrically-small air gap near the door-tank separation, bolt-joint separation, or a similar joint. This electrically-small air gap couples quasistatic EM energy from the outside to the inside of the metallic container, and vice-versa, using aperture-coupled electromagnetics.

The induction of a magnetic current is sometimes called a magnetic surface current, and can be described using its lowest order dipole term for reasonable ranges from the aperture. The accuracy of the dipole term is increased as the aperture size is reduced. For aperture sizes significantly smaller than a wavelength, the dipole magnetic moment description can be very accurate, as found in the quasistatic regime.

The dipole magnetic and electric moment induced at the aperture in the metallic container is the source of the coupling into the shadow region between the outside and the inside of the metal container. Since the magnetic and electric dipoles are similar to that of the original source (it maintains dyadic form, with change in polarization), a modification of the technique in Refs. [1-2] can be used with a theoretical description of the induced magnetic or electric source element at the aperture to enable range sensing, orientation sensing, and position sensing.

Therefore, the present disclosure describes how magnetoelectric quasistatic fields can penetrate sealed metal tanks and heavy metallic environments. Within these environments, energy is coupled through aperture coupling, where apertures can be extremely small, such as air gaps or dielectric gaps at tank doors or bolt and joints. The mechanism of energy coupling is through surface currents at the aperture.

As understood by the person of ordinary skill in the art, metal tanks are normally built with a hatch or door opening, which is shut close to permit safe storage within the metal tank. In the oil and gas industry, for example, the door is built to permit tank inspections. Due to the use of rubber gaskets for storage of pressurized liquid or gas, the dielectric gap between the metal frames and the door or hatch behaves as an electromagnetic aperture as shown in FIG. 1.

FIG. 1 illustrates a field description of coupling at an aperture in a metallic container. The penetration point in a metal surface is described in FIG. 1 as an electromagnetic aperture that couples external electric or magnetic fields (130) to the internal electric or magnetic fields (110). FIG. 1 therefore illustrates a portion of the metallic surface (120) which entirely encloses a container by extending beyond (115) the illustrated portion. The arrow direction (105) illustrates the inside of the container, while the arrow direction (125) illustrates the outside of the container. An arbitrarily-shaped aperture (135) is illustrated, though the person of ordinary skill in the art will understand that differently shaped aperture may be used in different metallic containers.

The conducting wall of the exemplary tank is composed of good conductors and the walls are considered as thick for the electric field, therefore having a thickness greater than some skin depth. This thickness is commonly used in metallic containers in the industry, for example in onshore water tanks, or off shore water tanks in the oil and gas industry.

The coupling of electromagnetic energy through a small gap is referred to as aperture coupling. Aperture coupling relies on diffraction theory to describe the field transfer. The ratio of aperture size to wavelength ($\alpha/\lambda$) can be distinctly described in three limiting regimes, $\alpha/\lambda \ll 1$ for apertures that are significantly smaller than a wavelength, $\alpha/\lambda \approx 1$ for approximately equal values, and $\alpha/\lambda \gg 1$ for apertures that are significantly larger than the wavelength. The shape of the aperture plays an important role in the transfer characteristics for the cases of $\alpha/\lambda \approx 1$ and $\alpha/\lambda \gg 1$, and is typically described by higher order diffracted fields. In the quasistatic regime, due to $\alpha/\lambda \ll 1$, the shape dependence can be neglected, and the transfer of electric and magnetic fields is solely based on the boundary condition for the electric field at the aperture screen. Only magnetic fields that are parallel to the plane of the aperture are transferred, and only electrical fields perpendicular to the plane of the aperture are transferred. Dipole moments can be used at the aperture as fictitious (virtual) or mathematical sources for the field inside the tank. These are given by:

$$\vec{M} = -\frac{2}{3\pi} a^3 \times (\hat{x} H_x + \hat{y} H_y) \quad (1)$$

$$\vec{P} = -\frac{1}{3\pi} a^3 \times (\hat{z} E_z),$$

where $\vec{M}$, $\vec{P}$ are the vector magnetic and electric dipole moments of the fictitious source at the aperture, and H and E are the respective magnetic and electric field components at the aperture due to the external magnetic and electric source.

Figure 2:
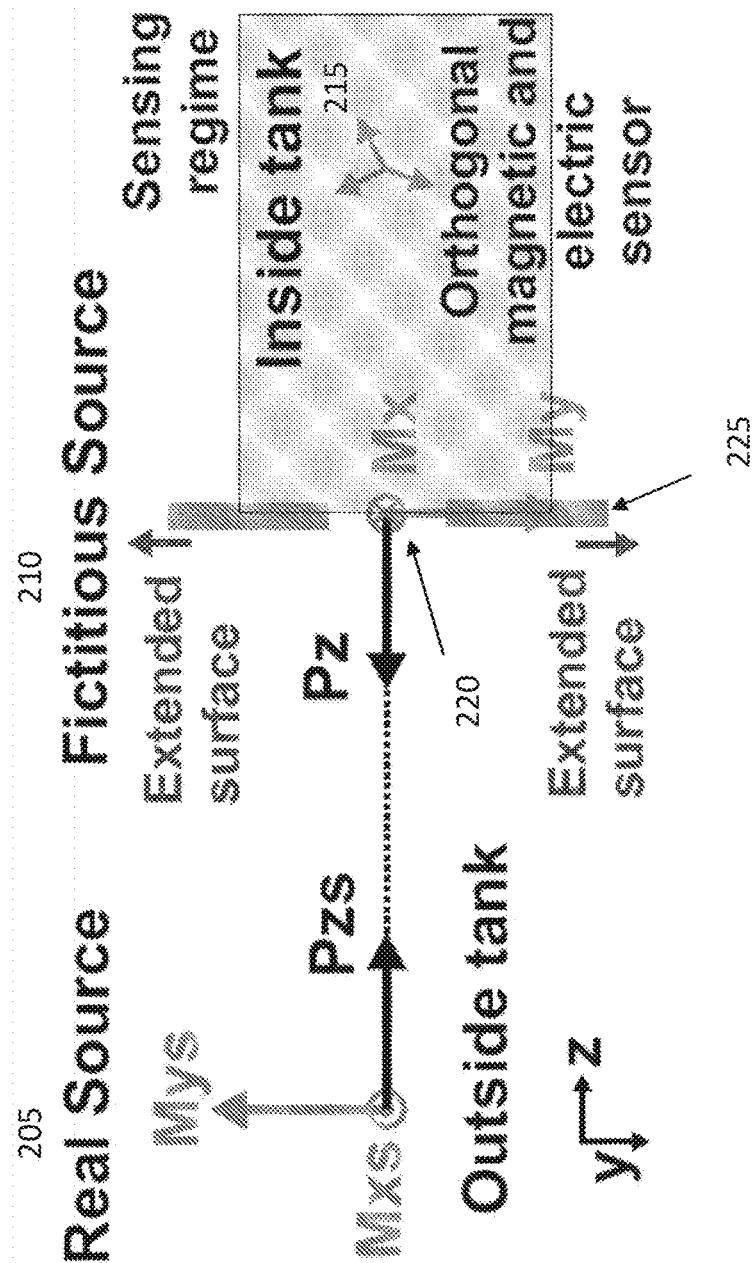

FIG. 2 illustrates a different view of the fields at the aperture, coupling inside and outside fields, as illustrated in FIG. 1. In FIG. 2, the real external sources (205) are used to develop fictitious sources (210) at the aperture (220) in the metallic surface (225), which are the source of field coupling to the orthogonal magnetic and electric sensors inside the tank (215).

The external sources of the electric and magnetic fields in FIGS. 1-2 generate magnetic and electric currents at the aperture, which in turn act as sources of radiation to the inside of the tank. Due to operation in the quasistatic regime, the currents at the aperture can be described as magnetic and electric dipole moments, and are independent of the shape of the aperture, as shown in FIG. 2. The aperture sources are fictitious sources and obey dipole behavior, which implies that their fields have a similar form, given by:

$$E \propto \frac{3(\hat{P}\cdot\hat{r})\hat{r} - \hat{P}}{r^3}, H \propto \frac{3(\hat{M}\cdot\hat{r})\hat{r} - \hat{M}}{r^3}, \quad (2)$$

where $\vec{r} = r\hat{r}$ is the range vector to any region inside the tank (in the sensing regime). Due to the similar forms of the magnetic dipole and electric dipole fields, and due to the orthogonality implied by the boundary conditions shown in FIG. 2, it is possible to use a single moment, $\vec{m}$ to describe the mathematical form of the coupled field:

$$E, H \propto \frac{3(\hat{m}\cdot\hat{r})\hat{r} - \hat{m}}{r^3}, \hat{m} = [\hat{P}, \hat{M}] \ \& \ \hat{P} \perp \hat{M} \quad (3)$$

where as noted, $\hat{P} \perp \hat{M}$. The voltage measured at an electric or magnetic sensor inside the tank, in the shadow regime, is given by $V \propto \partial[E, H]/\partial t$:

$$V \propto \frac{\partial [E, H]}{\partial t} = \omega \left[ \frac{3(\hat{m}\cdot\hat{r})(\hat{n}\cdot\hat{r}) - (\hat{m}\cdot\hat{n})}{r^3} \right], \quad (4)$$

where $\hat{n}$ is unit vector for the electric or magnetic sensor inside the tank, $\omega$ the radial frequency, $\vec{r} = r\hat{r}$ the dipole range vector, and $\vec{m}$ the source electric or magnetic moment with $|\vec{m}|=1$. Within the tank, the fields measured are due to fictitious sources at the aperture given by Eq. (1). The field sources couple to a sensor inside the tank through a dipole-dipole coupling given by Eq. (4).

The field coupling in Eq. (4) contains dot products and range dependencies. The dot products provide a spherical coordinate measurement of the angle direction of the receiver $[(\hat{m}\cdot\hat{r})(\hat{n}\cdot\hat{r})]$, and a measure of the orientation of the receiver $[\hat{m}\cdot\hat{n}]$, relative to the fictitious aperture dipole moments given by Eq. (1). The range dependency $[1/r^3]$ provides a measurement of the range from the aperture dipole moments. To capture the full 3D location and orientation dynamics, the fictitious aperture dipole moments must provide 3-axis orthogonal moments, and the receiver must also have the ability to detect the fields in all 3 orthogonal axis to completely sample in an unambiguous fashion the voltage coupling given by Eq. (4). An example of a transmitter or receiver that can transmit or detect quasistatic magnetic fields in three orthogonal directions would comprise three coils orthogonal to each other. Other implementations as understood by the person of ordinary skill in the art are also possible, for both magnetic and electric quasi-static fields.

Because the aperture preferentially couples electric and magnetic fields as shown in Eq. (1), the external source, in some embodiments, comprises both electric and magnetic quasistatic sources. Since only the electric fields perpendicular to the plane of aperture are transferred, only a perpendicular, external electric dipole source is needed. Magnetic fields parallel to the plane of aperture are transferred, thus only parallel external magnetic dipole sources are needed. However, since 3-axis orthogonal fictitious aperture dipole moments are needed, two external magnetic dipole sources are needed parallel to the aperture. To simplify the problem, the source generating two orthogonal magnetic moments (parallel to the plane of the tank aperture) and the single source generating an electric moment (perpendicular to plane of aperture) are located at the same location or electrically-close to each other. In general, if the location and orientation of the aperture is not pre-determined, the electric source will require all 3-axis orthogonal electric dipole moments, and the magnetic source will require all 3-axis orthogonal magnetic dipole moments. A field source having the capability to generate electric and magnetic fields in 3D will be able to adapt to the orientation of the specific aperture. In some embodiments, the field source can transmit the electric and magnetic quasistatic fields in all directions, with only the magnetic fields parallel to the plane of the aperture, as well as the electric field perpendicular to the plane of the aperture, being coupled through the aperture to the inside of the tank. In other embodiments, the source can be configured to only transmit the magnetic fields parallel to the plane of the aperture, as well as the electric field perpendicular to the plane of the aperture. For example, the source may detect the orientation of the aperture and adjust the transmitted fields accordingly, or the source may be configured by a user according to the specific aperture.

In some embodiments, the sensor (receiver) inside the tank is varying its orientation in addition to its position, and therefore requires both a 3-axis electric dipole receiver and a 3-axis magnetic dipole receiver. Therefore, a generalized system, capable of functioning with an arbitrary aperture orientation, will comprise an external source capable of transmitting electric and magnetic dipole fields, with 3-axis orthogonal electric dipole and 3-axis orthogonal magnetic dipole. The system will also comprise a sensor system with a 3-axis orthogonal electric receiver and a 3-axis orthogonal magnetic receiver. The source, or electronics circuit of the transmitter, can comprise a signal generator or function generator, which supplies a tone to an amplification circuitry and to an electric dipole antenna or magnetic dipole antenna (in all orthogonal axes). The sensor or receiver system can comprise an electric dipole antenna or magnetic dipole antenna (in all orthogonal axes) which picks-up a field. The field is then filtered and/or amplified, detected or sensed (by an analog-to-digital conversion, Fourier transform, and digital signal processing, or similar techniques).

If the source or sensor does not comprise of the full 3-axis electric and magnetic moments, then the voltage coupling in Eq. (4) is not fully sampled and thus will contain some ambiguity across all dimensions in the 3D coordinate system. In general, if the source and sensor comprises a 1-axis systems only (electric or magnetic), then the system can only be used to solve for 1D (one-dimensional) range or orientation. If the system consist of a 2-axis source and sensor (magnetic and/or electric), then the system can be used to solve for 2D (two-dimensional) position and orientation. Therefore, the person of ordinary skill in the art will understand that, in some embodiments, the full 3D positioning is carried out by having transmitters and receivers that are 3D-capable. In other embodiments, a more limited functionality can also be realized, for example in 2D with 2D-capable transceivers, and in 1D with 1D-capable transceivers.

In some embodiments, the magnetic dipole antenna in either the source or sensor is a coil-based antenna, which includes a single-layer coil, multi-layer coil, or magnetic/dielectric loaded single or multi-layer coil. The coil can take an arbitrary shape or size, as long as it is small relative to the wavelength. The electric dipole antenna in either the source or sensor can comprise a linear wire antenna that is fed either differentially or single-ended, and that can have endings connected to larger conductors such as plates or spheres (structure) to increase field strengths, where the structure and wire can take any shape and size, as long as it is small relative to the wavelength and does not have endings (wire or conductors) that are shorted or connected to each other.

Figure 3:
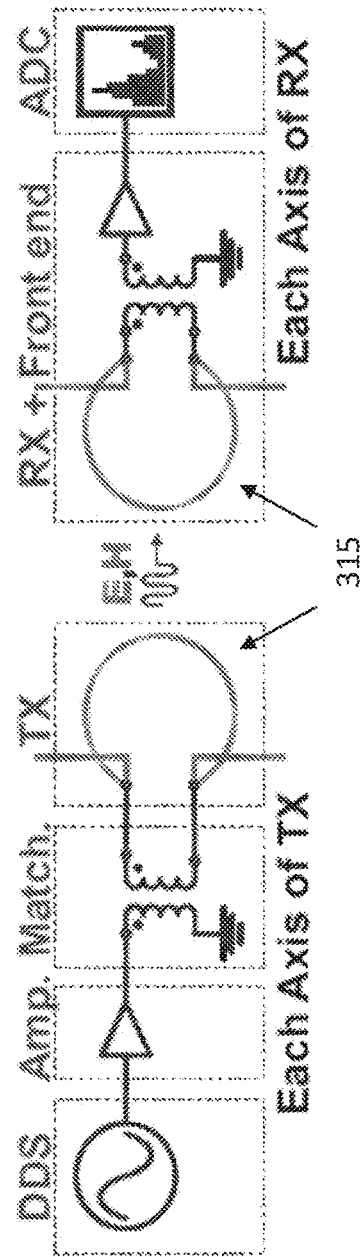
FIG. 3 illustrates the field coupling between the fictitious sources at the aperture and a sensor.

In the following, the mathematical treatment focuses on the two-dimensional (2D) problem with three degrees of freedom (3-DOF), the three degrees of freedom being y, z, $\phi$. This 2D problem requires two orthogonal dipoles at the transmitter (TX) and receiver (RX) (2×2=4 field couplings) as shown in FIG. 3, panel a. To permit linear sensitivity to position and orientation, the field couplings need to be re-written in transmit- and receive-centric forms:

$$F_{m1} = |V|_{(m1 \to n1)}^2 + |V|_{(m1 \to n2)}^2$$

$$F_{m2} = |V|_{(m2 \to n1)}^2 + |V|_{(m2 \to n2)}^2,$$

$$F_{n1} = |V|_{(n1 \to m1)}^2 + |V|_{(n1 \to m2)}^2,$$

$$F_{n2} = |V|_{(n2 \to m1)}^2 + |V|_{(n2 \to m2)}^2, \quad (5)$$

where $F_{m1}$ and $F_{m2}$ are the transmit-centric equations for TX 1 and 2 (m1, m2), which describe the total field power measured at all RX(s) due to each TX, and $F_{n1}$ and $F_{n2}$ are the receive-centric equations for RX 1 and 2 (n1, n2), which is the total power of all TX(s) measured at each RX.

FIG. 3, panel a, illustrates the field coupling between the fictitious sources at the aperture (305) and a mobile device (310) internal to the tank, in a two-dimensional plane. FIG. 3, panel b, illustrates a block diagram using circuit symbols know to the person of ordinary skill in the art, for each axis of the electric or magnetic sensor. In some embodiments, the internal sensor may also be fixed at a location within the tank, instead of being mobile within the tank.

The tone generation at the transmitter via a digitally synthesized signal (DDS) provides high signal to noise ratio (SNR), therefore the noise in the channel is limited to RX-noise. Quasistatic systems are operated in an interference-free narrow-band, at sufficiently high frequency to neglect 1/f noise, and using a high gain receive amplification. Therefore, Gaussian thermal noise, $^N V$, dominates. The received voltage is then $V \approx {}^S V + {}^N V$, where $^S V$ is the signal with no noise. The $F_{m,n}$ equations in Eqs. (5) are power-related by $|V|^2 = VV^*$. Due to quasistatic operation (kr<<1), the phase is negligible ($e^{-jkr} \sim 1$), so that:

$$|V|^2 = \left(-j\omega[\vec{F} \cdot \hat{n}] + {}^N V\right)\left(j\omega[\vec{F} \cdot \hat{n}] + {}^N V\right) \quad (6)$$

$$= \left(\omega[\vec{F} \cdot \hat{n}]\right)^2 + {}^N V^2,$$

where F=[E, H]. The following assumption are made with regard to Eq. (6): equal thermal noise in each channel, and a high signal-to-noise ratio or negligible Gaussian thermal noise, $^N V$. It is then possible to obtain ranging that is orientation-invariant, by summing the contributions from both transmit centric equations (see FIG. 3):

$$F_r = F_{m1} + F_{m2} \approx 5c^2/r^6, \quad (7)$$

where c is a constant. To obtain orientation sensing that is invariant of range, a ratio can instead be applied. However, here the orientations are either due to orientations of the mobile device ($\phi_m$), or direction angles which are relative to the fixed-device orientations ($\phi_n$) (see FIG. 3, panel a). The m- and n-orientation ratio due to $\phi_m$ and $\phi_n$, respectively, is given by $F_{\phi m}$ and $F_{\phi n}$, respectively:

$$F_{\phi m} = F_{m2}/F_{m1} \& F_{\phi n} = F_{n2}/F_{n1} \quad (8)$$

The technique of the present disclosure relies on the possibility to invert Eqs. (7), (8), and (9) through a direct linear inversion method. The form and inversion for $\phi_m$ is given by:

$$F_{\phi m} = \frac{5 - 3\cos(2\phi_{m1})}{5 + 3\cos(\phi_{m1})}, \phi_m = \frac{1}{2}\cos^{-1}\left[\frac{5 - 5 \times F_{\phi m}}{3 \times F_{\phi m} + 3}\right]. \quad (9)$$

Similarly, the direction angle to the device is given by:

$$\phi_n = \frac{1}{2}\cos^{-1}\left[\frac{5 - 5 \times F_{\phi n}}{3 \times F_{\phi n} + 3}\right]. \quad (10)$$

The range function, $F_r$, given in Eq. (7) can be directly inverted:

$$r = (5c^2/F_r)^{1/6}. \quad (11)$$

Equations (9), (10), and (11), provide the necessary parameters to obtain the complete-drift free position and orientation of the mobile device in the y-z plane investigated in FIG. 3 panel a:

$$y = r \cos \phi_n, z = r \sin \phi_n, \phi = \phi_m - \phi_n, \quad (12)$$

where (y, z) gives the two-dimensional position of the device, and $\phi$ gives the two-dimensional orientation of the device. Formulated in three-dimensions, the technique can enable navigation in an enclosed metal tank with small penetration points, with six degrees of freedom (6-DOF).

Quasistatic fields can enable position and orientation sensing in enclosed metal tanks with very small penetration points. Such tanks are common in the oil and gas industry as storage tanks both in onshore and offshore environments, where the penetration points are due to gaskets or similar dielectric gaps between the frame and the door or hatch. The gap is modeled as an electrically-small aperture. When an external quasistatic source or transmitter is placed outside the tank, a fictitious quasistatic source is induced at the gap, due to the source's field at the aperture, which in turn acts as a means to couple energy into a sensor in the tank.

The energy transfer can be dependent on the nature of the source and sensor. Specifically, the energy transfer depends on either electric or magnetic coupling, and on the orientation and location of both the field source and the sensor. By using a suitable configuration of electric and magnetic sources and sensors, the coupled fields can be used to invert for position and orientation of the sensor.

The mechanism of aperture coupling can be described via an experiment for fields coupled from the inside to the outside of a completely sealed ballast tank, which is commonly used in the deep water, offshore oil and gas industry.

The measurements were conducted in a ballast tank of an offshore oil platform in the Gulf of Mexico. Ballast tanks are important to the stability of offshore oil platforms, and are placed in the large metal columns of the oil platform.

The experiment configuration is that shown in FIG. 2. To simplify the system for proof of concept of the aperture coupling, only the magnetoquasistatic (MQS) emitter/transmitter and sensor/receiver are used in FIG. 2. The person of ordinary skill in the art will understand that in other embodiments, both the electric and magnetic quasistatic fields can be used. In this example, the antennas are based on coils as shown in FIG. 3, panel b. To demonstrate ranging, a three-axis orthogonal transmitter and receiver system was employed. Three direct digital synthesizer (DDS) sources are used on the transmitter, in this example. Each DDS outputs a tone (60-100 kHz) which is amplified and fed to a resonant coil. The tones are sensed at the receiver coils. The coils were 50-turns of tightly wound 28-AWG wire with a 20 cm square side on the receiver system, and 18-AWG wire with 15 cm square side on the transmitter system. The system had a signal-to-noise ratio sufficiently good for outdoor measurements up to 40 m.

Figure 4:
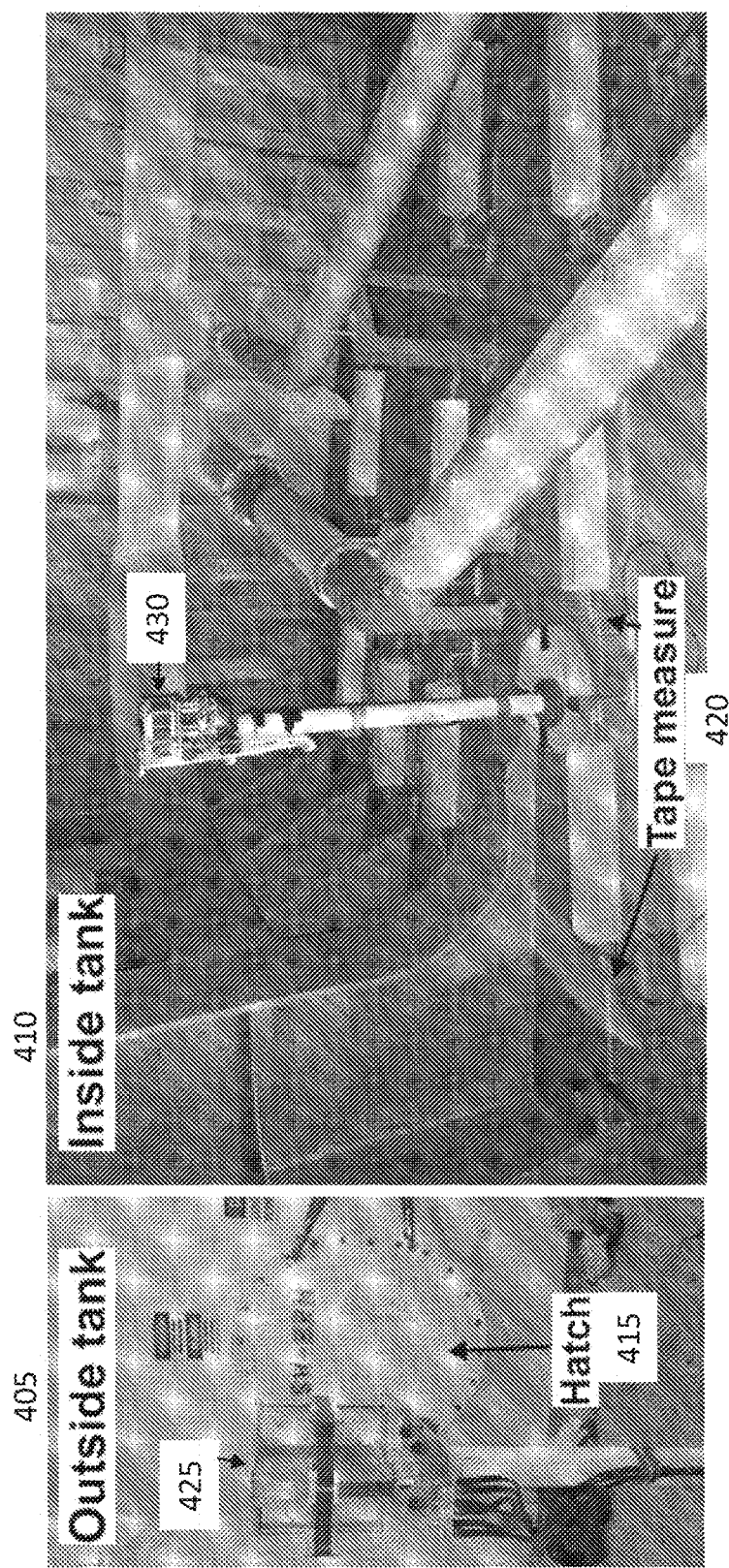
FIG. 4 shows an exemplary setup for measurements.

FIG. 4 shows the experimental setup. A three-axis device (430) is placed inside the ballast tank (410), and moved, inside the ballast tank, at fixed steps of 3 ft along a linear direction as measured with a tape (420). At every measurement point or step the field coupling was measured (425) outside the tank (405), with the hatch (415) open, and measured again with the hatch closed. Both open and closed hatch door configurations were recorded. The hatch was closed so that very little, if any, air or dielectric gap existed between the hatch door and the metal tank wall. The tank was otherwise completely sealed and composed of a wall with a thickness of one inch.

Figure 5:
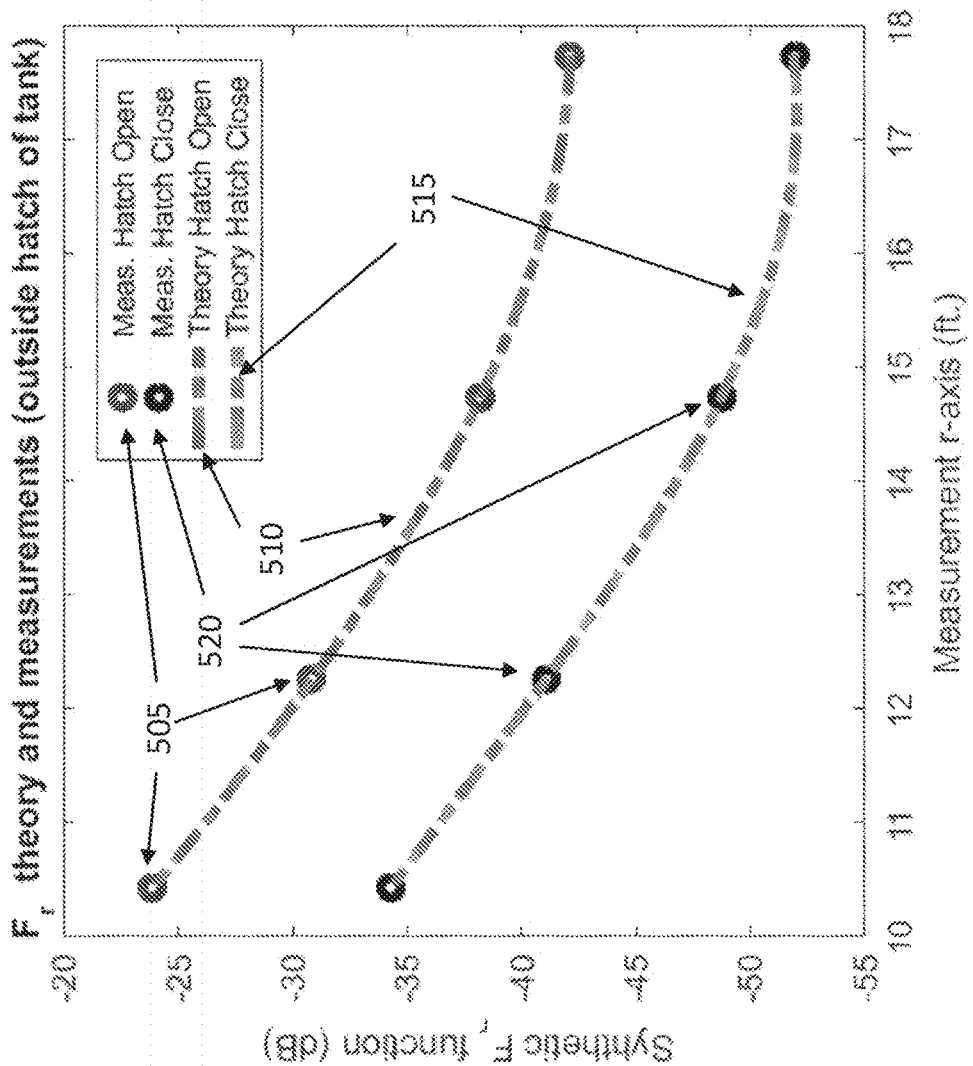
FIG. 5 illustrates measurements taken with the setup of FIG. 4.

FIG. 5 illustrates measurements of $F_r$ in units of dB as a function of range compared with theoretical curves for both measurements with the hatch open and closed. Specifically, the data in FIG. 5 is for measurements (505) and theory (510) with the hatch open, and measurements (520) and theory (515) with the hatch closed.

Figure 6:
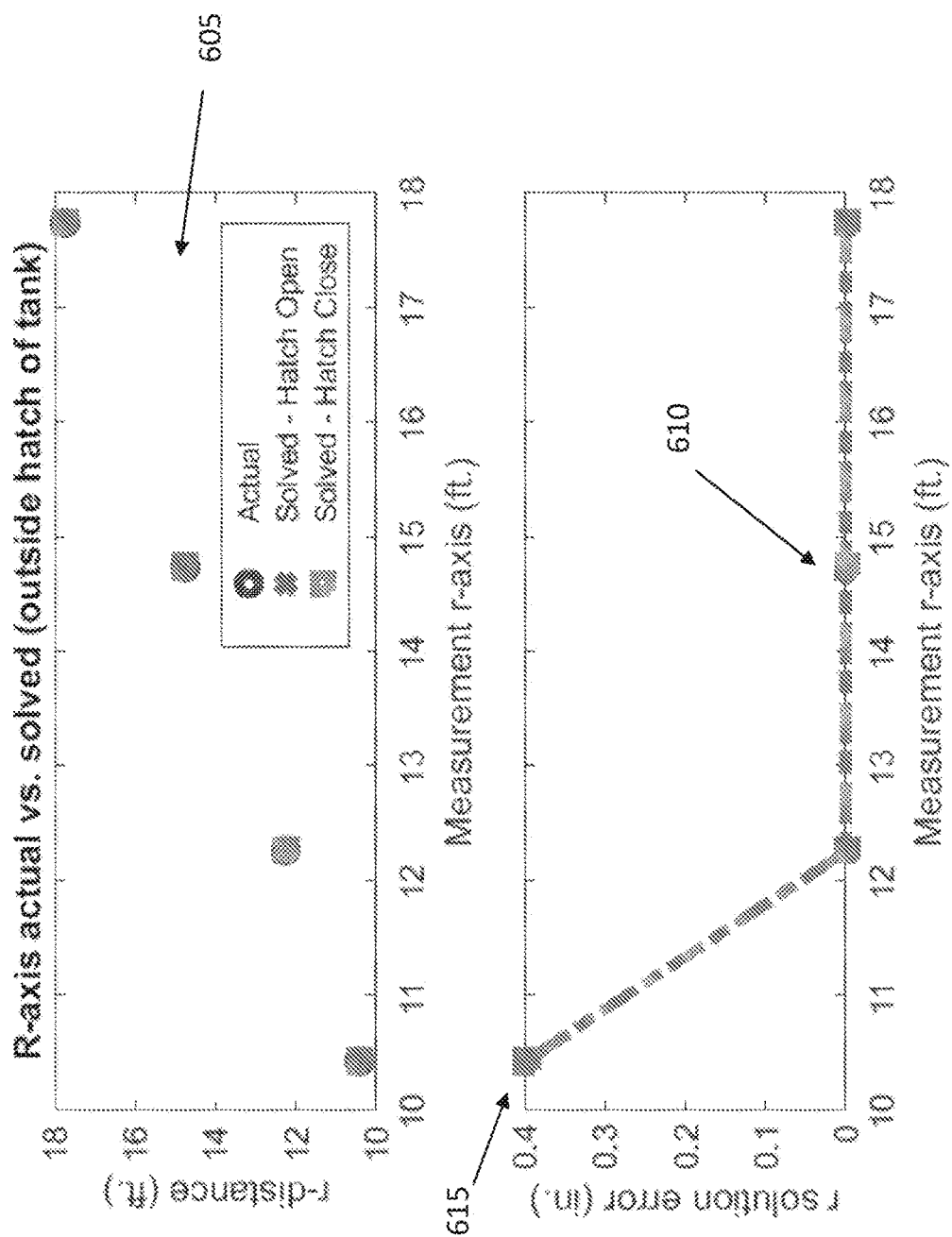
FIG. 6 illustrates results of the positioning measurements.

FIG. 6 illustrates a comparison between actual and solved range (605) for the distance, where the points are too closely overlapping to be illustrated with a discernible difference. FIG. 6 also illustrates the resolution error in the estimated range (610), showing a peak error in range estimation with a value less than 0.4 inch (615).

The field couplings measured at each step, as described above according to the setup of FIG. 4, are converted to power and summed as described in Eq. (7). Measurements are collected for when the hatch door was open and closed, and compared to the theoretical curves as illustrated in FIG. 5. An offset is applied to make the measurements agree with the theoretical curves at the furthest range measurements. This offset removes any unknown gains and losses in the system. The dots (505) plotted in FIG. 5 show measured values vs. range, whereas the theory curves (510, 515) show the expected values based on quasistatic ranging. The range to the device is found through the inversions given in Eq. (11).

The present disclosure describes how quasistatic fields can be used to enable position and orientation sensing of a device located within a sealed metal tank, such as a ballast tank. The fields are coupled through very small penetration points such as the dielectric gap of the hatch door in the frame of a ballast tank. The technique described permits high accuracy. The present disclosure describes how to solve for position and orientation, and demonstrates measurements of ranging with an accuracy of 0.4 inch or better.

As understood by the person of ordinary skill in the art, in some embodiments a magnetoquasistatic field, an electric quasistatic field, or a magnetoelectric quasistatic field is a class of electromagnetic field in which a magnetic or electric field slowly oscillates. The person of ordinary skill in the art will understand that such slowly oscillating magnetic or electric field are not electromagnetic wave radiation as normally understood, e.g. visible light radiation. In some embodiments, the quasistatic range can be understood considering the distance between a sensor and the object to be detected, r, and the wavelength of the electromagnetic field, $\lambda$. In some embodiments, the quasistatic range is effective when $r \ll \lambda$.

Through-the-wall non-line-of-sight (NLoS) positioning is a useful technology in several fields; in particular, it is critical in homeland security and military applications. Due to the lack of penetrability or multi-path scattering, existing high-frequency propagation-based techniques suffer in NLoS use. In contrast, quasistatic fields are weakly perturbed by lossy dielectrics and provide accurate positioning in NLoS environments.

In some embodiments, quasistatic positioning systems include short range systems and short-to-long range systems. In some embodiments, short-range quasistatic systems use a low frequency of a few kilohertz to avoid ground effects. However, the low frequency and the increased ground effects with range are disadvantages that can limit their operation to a few meters. In some embodiments, short to long range systems use a higher frequency of up to a few hundred kilohertz, operating still well within the quasistatic range ($r \ll \lambda$), to enable positioning up to many tens of meters. In some embodiments, to enable accurate positioning, short to long range systems account for secondary fields due to the ground, or nearby electrically large conductors.

In some embodiments, the transmitter or the receiver may comprise one or more coils, for example square coils. For example, two coils of a transmitter may be perpendicular to each other. The corresponding receiver would also have two coils in the same orientation of the transmitter. The transmitter and the receiver can also comprise three coils, each oriented in one of the three directions of a Cartesian system. An example with three perpendicular coils can be seen in FIG. 4 (425, 430).

In some embodiments, the method of the present disclosure comprises: providing at least one transmitter configured to transmit a quasistatic field at a first wavelength, the at least one transmitter comprising at least two coils orthogonal to each other; positioning the at least one transmitter at a distance less than the first wavelength from a metallic container and outside the metallic container, the metallic container comprising metallic walls entirely enclosing an inner space apart from at least one aperture in the metallic walls, the at least one aperture having lateral dimensions less than the first wavelength. For example the distance from the metallic container walls may be less than 10 wavelengths, the thickness of the metallic walls may be more than 3 skin depths of the metal of the walls, and the lateral dimensions of the aperture may each be less than 10 wavelengths.

The method may further comprise: providing at least one receiver configured to detect the quasistatic field, the at least one receiver being located within the metallic container; transmitting the quasistatic field with the at least one transmitter; coupling the quasistatic field at the at least one aperture; measuring the quasistatic field with the at least one receiver by approximating the quasistatic field at the last one aperture as a dipole field; and determining a position within the metallic container of the at least on receiver based on the measured quasistatic field. The quasistatic field may be a quasistatic electric field if the electric component is predominant and the magnetic component can be neglected, a quasistatic magnetic field if the magnetic component is predominant and the magnetic component can be neglected, or an electromagnetic quasistatic field if both components are utilized or comparable in intensity.

In some embodiments, the transmitter may have one, two, three or more coils orthogonal to each other, and the receiver may have one, two, three or more coils orthogonal to each other. In some embodiments, both the receiver and transmitter are transceivers, enabling communication between the inside and the outside of the metallic container. For example, the continuous monitoring of the location of the sensor inside a tank can be carried out by communicating between the two transceivers. In some embodiments, the receiver may be located outside the tank and the transmitter within the tank. In some embodiments, determining a position within the metallic container of the at least on receiver is to continuously monitor the position of a remotely controlled vehicle within the metallic container. The ROV may comprise the receiver/transceiver.

In some embodiments, the at least one transmitter and the at least one transceiver each comprise a linear wire antenna to transmit or receive an electric dipole field. In some embodiments, the quasistatic field is an electromagnetic quasistatic field, comprising both a magnetic field and an electric field. In some embodiments, the at least one transmitter is configured to transmit the electromagnetic quasistatic field with a field component in each of three orthogonal directions, the at least one receiver is configured to receive the electromagnetic quasistatic field in each of the three orthogonal directions. In some embodiments, the last one aperture comprises one aperture, the aperture lying in a plane, and the coupling the quasistatic field at the at least one aperture comprises: coupling a magnetic field of the electromagnetic quasistatic field only parallel to the plane of the aperture, and coupling an electric field of the electromagnetic quasistatic field only normal to the plane of the aperture.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The references in the present application, shown in the reference list below, are incorporated herein by reference in their entirety.

REFERENCES

[1] D. D. Arumugam, "Decoupled Range and Orientation Sensing in Long-Range Magnetoquasistatic Positioning," in IEEE Antennas and Wireless Propagation Letters, vol. 14, no., pp. 654-657, 2015.
[2] D. D. Arumugam, "Single-Anchor 2-D Magnetoquasistatic Position Sensing for Short to Long Ranges Above Ground," in IEEE Antennas and Wireless Propagation Letters, vol. 15, no., pp. 1325-1328, 2016.
[3] D. D. Arumugam, "Through-the-wall magnetoquasistatic ranging," in IEEE Antennas and Wireless Propagation Letters, vol. PP, no. 99, pp. 1-1.

What is claimed is:

1. A method comprising:
providing at least one transmitter configured to transmit a quasistatic field at a first wavelength;
positioning the at least one transmitter at a distance less than the first wavelength from a metallic container and outside the metallic container, the metallic container comprising metallic walls entirely enclosing an inner space apart from at least one aperture in the metallic walls, the at least one aperture having lateral dimensions less than the first wavelength;
providing at least one receiver configured to detect the quasistatic field, the at least one receiver being located within the metallic container;
transmitting the quasistatic field with the at least one transmitter;
coupling the quasistatic field at the at least one aperture;
approximating the quasistatic field at the at least one aperture as a dipole field;
measuring the quasistatic field with the at least one receiver; and
determining a position within the metallic container of the at least one receiver based on the measured quasistatic field,
wherein the quasistatic field is a quasistatic electric field, a quasistatic magnetic field, or an electromagnetic quasistatic field.

2. The method of claim 1, wherein the metallic container comprising walls having a thickness more than one skin depth.

3. The method of claim 1, wherein the at least one aperture is an air gap.

4. The method of claim 1, wherein the at least one aperture is a rubber gasket.

5. The method of claim 1, wherein the at least one aperture is a joint.

6. The method of claim 1, wherein the at least one aperture is made of a dielectric material.

7. The method of claim 1, wherein the at least one transmitter comprises at least two coils orthogonal to each other.

8. The method of claim 1, wherein the at least one receiver comprises at least one coil.

9. The method of claim 1, wherein the at least one receiver comprises at least two coils orthogonal to each other.

10. The method of claim 1, wherein the at least one transmitter comprises at least three coils orthogonal to each other.

11. The method of claim 1, wherein the at least one receiver comprises at least three coils orthogonal to each other.

12. The method of claim 1, wherein the at least one transmitter comprises at least one transceiver, and the at least one receiver comprises at least one transceiver.

13. The method of claim 1, wherein determining a position within the metallic container of the at least on receiver is to continuously monitor the position of a remotely controlled vehicle within the metallic container.

14. The method of claim 1, wherein the at least one transmitter and the at least one transceiver each comprise a linear wire antenna to transmit or receive an electric dipole field.

15. The method of claim 1, wherein the quasistatic field is an electromagnetic quasistatic field.

16. The method of claim 15, wherein the at least one transmitter is configured to transmit the electromagnetic quasistatic field with a field component in each of three orthogonal directions, the at least one receiver is configured to receive the electromagnetic quasistatic field in each of the three orthogonal directions.

17. The method of claim 16, wherein:

the at least one aperture comprises one aperture, the aperture lying in a plane, and the coupling the quasistatic field at the at least one aperture comprises:

coupling a magnetic field of the electromagnetic quasistatic field only parallel to the plane of the aperture, and coupling an electric field of the electromagnetic quasistatic field only normal to the plane of the aperture.

* * * * *